United States Patent
Laforce (10) Patent No.: US 11,225,717 B2
(45) Date of Patent: Jan. 18, 2022

(54) FIXTURE FOR COATING OF DOUBLE-ENDED TOOLS

(71) Applicant: Oerlikon Surface Solutions AG, Pfäffikon, Pfäffikon (CH)

(72) Inventor: Phillip Joel Laforce, Taylor, MI (US)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 43 days.

(21) Appl. No.: 16/768,227

(22) PCT Filed: Nov. 29, 2018

(86) PCT No.: PCT/EP2018/083002
§ 371 (c)(1),
(2) Date: May 29, 2020

(87) PCT Pub. No.: WO2019/106088
PCT Pub. Date: Jun. 6, 2019

(65) Prior Publication Data
US 2020/0308699 A1    Oct. 1, 2020

Related U.S. Application Data

(63) Continuation of application No. PCT/EP2018/083002, filed on Nov. 29, 2018.

(51) Int. Cl.
| | |
|---|---|
| *C23C 16/458* | (2006.01) |
| *C23C 16/04* | (2006.01) |
| *C23C 16/44* | (2006.01) |
| *C23C 14/50* | (2006.01) |

(52) U.S. Cl.
CPC .......... *C23C 16/4588* (2013.01); *C23C 14/50* (2013.01); *C23C 16/042* (2013.01); *C23C 16/4408* (2013.01)

(58) Field of Classification Search
CPC ............................ C23C 16/4588; C23C 16/50
See application file for complete search history.

(56) References Cited

U.S. PATENT DOCUMENTS

| | | | |
|---|---|---|---|
| 2,912,351 A | 11/1959 | Danner et al. | |
| 5,096,736 A * | 3/1992 | Anthony | C23C 16/458 427/590 |
| 5,350,455 A | 9/1994 | Mahler | |
| 5,653,812 A * | 8/1997 | Petrmichl | C23C 16/0245 118/723 E |
| 6,511,268 B1 * | 1/2003 | Vasudeva | B23B 31/1071 279/14 |
| 2009/0095215 A1 | 4/2009 | Struempfel et al. | |
| 2011/0081215 A1 * | 4/2011 | Nakamura | B23B 51/02 408/230 |
| 2013/0273398 A1 | 10/2013 | Hoshi et al. | |

* cited by examiner

*Primary Examiner* — Keath T Chen (57) ABSTRACT

Fixture (1) for exposing two opposite ends of an object to be coated (6) to a vapor deposition while masking an intermediate portion (8) of the object against being coated, comprising an object holding device (OHD), whereas the object holding device (OHD) consists of at least one battery (3) of hole plate strips (2) which are designed and arranged that way that each single hole (retaining hole; H) is formed by a pair of hole plate strips (2) that way that the first segment (4) of the hole (H) is embodied by the preceding hole plate strip (2) and that the second segment (5) of the hole (H) is embodied by the subsequent hole plate strip (2).

14 Claims, 8 Drawing Sheets

FIXTURE FOR COATING OF DOUBLE-ENDED TOOLS

TECHNICAL FIELD OF THE INVENTION

The present invention relates to fixtures for elongated double-ended objects and in particular tools. An elongated double-ended tool can be divided into a first working area at the one end and a second working area at the other end and a non-working area between the first working area and the second working area. The elongation of the tool defines a tool axis.

TECHNICAL BACKGROUND

In order to increase the lifecycle of such tools, very often both working areas need to be coated. In contrast, it is desirable not to coat the non-working area. In order to coat these tools, typically a physical vapor deposition method, such as sputtering and/or cathodic arc deposition, is used. Here the tools are inserted into a vacuum chamber onto a rotating carousel which guides them past a sputtering or arc deposition target thereby exposing them to the coating material. The rotation axis of the carousel defines a carousel axis. As this process is a quite expensive process and evaporating the vacuum chamber takes quite long, it is desirable to put as many tools as possible into the vacuum chamber for a coating run.

In order to efficiently charge and de-charge the vacuum chamber, the tools are not inserted into the chamber one by one, but they are loaded on tool fixtures which are realized to be loaded with a high number of tools.

In tool fixtures according to prior art the tool axis is parallel to the carousel axis. Typically, such tool fixtures themselves form small carousels, which as well rotate with an axis parallel to the carousel axis. This defines a fixture axis. In order for a tool—when passing by the coating target—not always to face the target with the same part of its surface, it is necessary in most cases to rotate the tools themselves around the tool axis, thereby realizing a triple rotation system. As is clear from the description above, such a triple rotation system is complicated to realize and therefore expensive. In addition, the number of tools that can be inserted into such a system is limited.

For single ended tools fixtures according to prior art exist, where the tool axis is perpendicular to the carousel axis and the fixture axis. One possibility to use these for double-ended tools would be to first coat the first working area and then, in a second coating run, to coat the second working area. Unfortunately this requires two coating runs as well as changing the orientation of every tool between the two coating runs. This is complicated and time consuming and therefore expensive and not acceptable.

Figure 9:
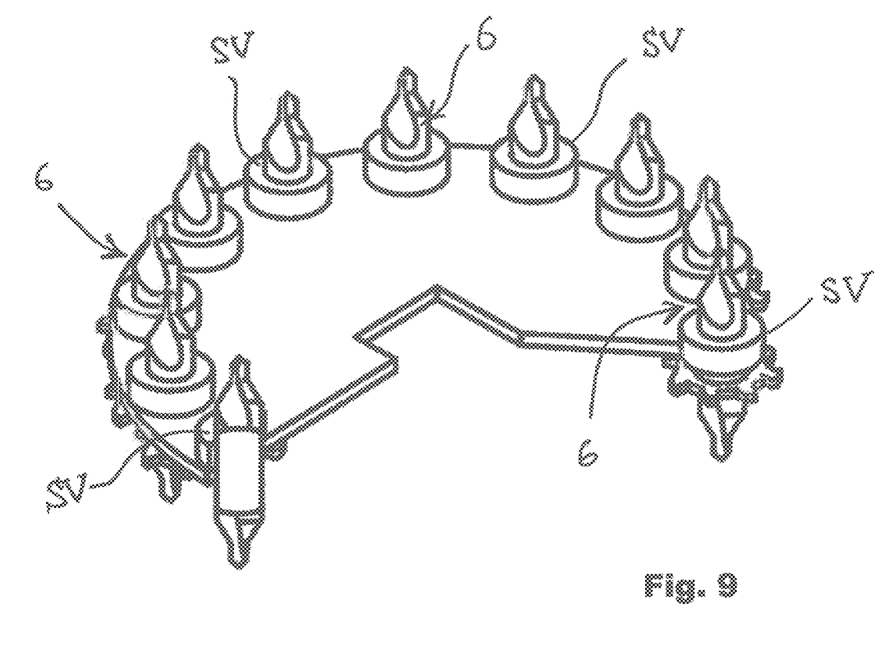

Another—at least internally considered—advanced state of the art coating device is shown by informatory FIG. 9. Each double-ended tool is stuck with some radial play through a sleeve SV. Hereinafter, the sleeve must be closed in radial direction in order to eliminate the radial play and to firmly hold the double-ended tool. After coating, the sleeve must be loosened again in order to pull out the ready coated tool out of the sleeve.

OBJECT OF THE INVENTION

Problem to be Solved

It is therefore an objective of the present invention to provide a more powerful fixture for elongated double-ended tools to simultaneously hold the double-ended tools, and mask them (prevent them from being coated) on their non-working surface.

The Inventive Solution

The inventive solution is a device that, when assembled, supports common, double-ended tools such as drill bits and end mills, etc., and exposes the working end of these tools to a coating process, while simultaneously covering (masking) the non-working area of the tools, preventing coating application in these areas.

The basic concept of this fixture allows a range of double-ended tools of varying lengths and diameters to be coated without clips or other secondary holding devices. The geometry of this fixture itself supports the tools in a unique way.

Explained in greater detail, the invention could be summarized as follows:

In order to solve the above mentioned problem, a fixture for exposing two opposite ends of an object to be coated to a vapor deposition is proposed. The fixture is not only holding the object but also masking an intermediate portion of the object against being coated. The inventive fixture possesses an object holding device. According to the invention, the object holding device consists of at least one battery of hole plate strips. The said object holding strips are designed and arranged that way that each single hole (retaining hole) for embracing and therefore holding an object to be coated is not formed as a through hole through a single plate, but by a pair of hole plate strips. Each single hole is formed or embodied that way that the first segment of the hole is embodied by the preceding hole plate strip and that the second segment of the hole is embodied by the subsequent hole plate strip.

That way it is possible to fix and release every object to be coated in the fixture quickly and reliably while masking its intermediate area. The release after completion of coating is no problem even if a thicker coating is deposited which hindered the object to be coated from being pulled out of a retaining hole that cannot been split up into two separate sections. Moreover, the inventive fixture makes it possible to coat such objects that are—for example—embodied as tools having working zones at both free ends with a diameter bigger as the diameter of the intermediate shaft.

Optional Improvements of the Invention

It is highly preferred if the fixture is designed that way that the objects to be coated are held in a position that their main longitudinal axis is—when passing the target—oriented perpendicular to the surface of the target intended for being for example sputtered for deposition. Ideally, the longitudinal axis is permanently oriented perpendicular to the—in most cases singular—rotational axis of the fixture. In preferred cases, this condition is fulfilled if the objects are held that way that their main longitudinal axis extends in horizontal direction.

That way it is not necessary to rotate the objects to be coated around their longitudinal axis in order to ensure a uniform coating. That allows—always or in most cases—a more dense packing of the objects to be coated so that the capacity of the fixture is improved.

Preferably, each of the holes is designed that way that it is at least predominantly or essentially in surface contact with the grasped object along its whole circumference. That way it is reliably excluded that the contact area of the hole which grasps the object allows a more than insignificant intrusion or a passing of the vaporized coating material into or through a gap between the object holding strip and the surface of the object held by it.

Preferably, the object holding device comprises magnets attracting and thereby—at least additionally—immobilizing the objects held by the hole plate strips. The use of such magnets allows an extremely quick mounting and unmounting of the objects to be coated to the fixture. The magnets are preferably fully mounted within the masked area and will be therefore not be polluted by unwanted deposition.

A most preferred solution provides that the object holding device comprises two batteries of hole plate strips which are arranged in parallel, and which (in a fully mounted and loaded state of the fixture) form a masked interior space between one another, which is fully or at least essentially free of vapor deposition.

Preferably, the magnets are individual parts that are positioned within the said masked interior space. If the fixture is designed for coating of rows of identical objects, it is preferred to provide one single magnet bar per row. If a number of different objects per row is coated, it is more preferred to provide one magnet block with an individual size per object to be coated. Such different sized magnets can be a component of the fixture system that is claimed here, too.

An interesting option is if said magnet is (and preferably all said magnets are) dimensioned that way that it is immobilized by form fit between two opposite hole plate strips against movement in direction of and opposite to a main axis of an object to be coated.

Ideally, the fixture comprises two opposite rail devices for threading up hole plate strips between them one after the other, forming thereby a planar object holding device or a planar part thereof. Preferably, the guiding action of the rail devices is a guiding action in horizontal direction so that the hole plate strips can be moved for mounting in vertical direction along the rail device.

Preferably, each rail device comprises two parallel guide installations. Ideally, each guide installation is embodied as a slot which is embracing a face side and parts of the two directly neighbored sides of the hole plate strips inserted into this slot. That way a secure sealing action is provided for making quick mounting and unmounting easier even if there is a remarkable play or lost motion between the slot and the hole plate strip.

Ideally, each rail device is formed by a preferably vertically oriented bar, i.e. a bar whose main longitudinal axis along its longest extension is oriented vertically. Preferably, the bar is formed by a one part bar. Ideally, said bars are carried by a base cross bar which is preferably horizontally oriented.

Mostly, the fixture comprises a foot unit which rotatably bears said base cross bar. Such a foot unit provides—without being bolted or additionally clamped to the deposition chamber—for a secure standing of the fixture in the chamber. It allows to load and unload the fully equipped fixture by means of a fork lift or a similar transportation tool into and out of the deposition chamber.

Preferably, the fixture comprises a closing cross bar which can be opened or removed for threading up hole plate strips, and which can be closed hereinafter. The closing cross bar preferably serves for closing off the masked interior space in the area of its loading opening. The closing cross bar is ideally positioned diametrically opposite to the base cross bar if any bar in the base region. Preferably, the closing cross bar is equipped with a—mostly bracket-like—handle for comfortably and securely manipulating it.

Ideally, said object holding device has planar main surfaces with said main surfaces preferably oriented vertically—when the fixture is in its correct operational state.

Furthermore, the inventive fixture is a part of a functionally enlarged fixture system. It is a fixture system for exposing two opposite ends of an object to be coated to a vapor deposition. The fixture system is masking an intermediate portion of the object against being coated. It comprises an object holding device. According to the invention, the fixture system includes (i.e. comprises or preferably consists of) a fixture as defined by the whole contents disclosure of this specification including the drawings and, in addition, different hole plate strips embodying different hole segments. The difference is preferably realized as a difference in diameter, or in average diameter, or in clear cross section, or in number of hole segments and/or in position of hole segments.

In addition, a method is claimed.

The method serves for exposing two opposite ends of an object to be coated concurrently to a vapor deposition while masking an intermediate portion of the object against being coated.

According to the invention, the method is performed as follows:

The object or each object to be coated is positioned relative to a first hole plate strip embodying a first segment of a hole so that said segment of the hole embraces the object to be coated in an area to be masked against coating. Moreover, the object to be coated is positioned relative to a second hole plate strip embodying a second segment of a hole so that said segment of the hole embraces the object to be coated in an area to be masked against coating. The two hole plate strips are positioned that way that they abut against each other (close together) so that they jointly form a hole that totally embraces and holds the object to be coated. The disassembly after completion of the coating takes place accordingly.

Preferably, hole plate strips are used that provide a plurality of hole segments each so that synchronously a plurality of objects to be coated will be grasped and fixed when positioning two hole plate strips as mentioned before.

Preferably, the method is performed that way that at first a lower hole plate strip is positioned that way that its hole section forms—for each object to be coated with it—a basin-like concave recess for laying in the object. Secondly, an upper hole plate strip is brought in position so that its hole sections form turret-like concave recesses that close with each of the one or more of the basin-like concave recesses.

Preferably, this procedure is repeated—preferably at least four times, better at least six times—mostly in vertical upward direction, before the fixture is fully loaded and ready for the coating to be started. The unloading is performed accordingly.

Moreover, protection is sought for a vapor deposition installation with a deposition chamber, at least one target, an evacuation pump, preferably a working gas inlet unit and a fixture whereas the said fixture is rotatably borne in the deposition chamber and can be set in rotation during vapor deposition.

Further effects, advantages and design possibilities are disclosed by the following description of a preferred embodiment by means of the Figures.

LIST OF FIGURES

FIGS. 1a and 1b

Said Figures show two early prototypes of the fixture concept. Note how the "hole plates" have been slit into "strips" that allow successive rows of tools to be stacked vertically into the fixture's frame. A pair of these "strips" is inserted into the very bottom of the fixture, then a row of tools is laid across these strips. Thin, preferably rectangular magnets are then placed on top of the tools. Another pair of strips is placed into the fixture, followed by another row of tools, and another row of magnets. This process is repeated until the fixture is fully loaded with tools.

FIG. 2

This picture shows how the last strip can be inserted into the fixture.

FIG. 3

The basic "welded frame" assembly of the fixture can accommodate plate strips with various diameter holes, and thereby accommodate tools of multiple different diameters.

FIG. 4

The "cap block" assembly shown above prevents the coating from entering the inside of the fixture. This causes the center of the tools to be "masked" from the coating process, leaving coating only on the working portion of the tools. The cap block assembly also serves to apply vertical clamping force to the stack of hole plate strips, and the tools held therein.

FIG. 5a

The drawing shows the core of the fixture, i.e. the welded frame, without the hole plate strips. Hole plate strips are inserted into this frame in matching pairs, followed by a row of tools, then a row of magnets. This process is repeated until the fixture is fully loaded.

FIG. 5b

The drawing shows the fixture of 5a with the hole plate strips fully inserted.

FIG. 5c

The drawing shows the front view of the fixture with the hole plate strips fully inserted, and a cover on it.

FIG. 5d

The drawing shows a side view of the fixture of FIG. 5c.

FIG. 6

A cut through an inventive fixture, which is loaded with tools, is shown in a perspective view. The magnets are shown in the drawing as well. These magnets simply rest on top of the row of tools below, and serve as a secondary method of ensuring that the tools do not move laterally in the fixture. The primary reason the tools do not move is that the weight of the hole plate strips themselves bears on the tools, and serves to keep them from moving laterally during the coating process.

FIG. 7

This shows a cut through an inventive fixture as well, however, only the first row of tools is loaded. Shown on the tools is a rectangular permanent magnet as well as the second plate hole strip at the back already inserted.

FIG. 8

This shows an example of a double-ended tool which is as such state of the art.

FIG. 9

This Figure shows a state of the art device for coating double-ended tools.

A PREFERRED EMBODIMENT

Figure 8:
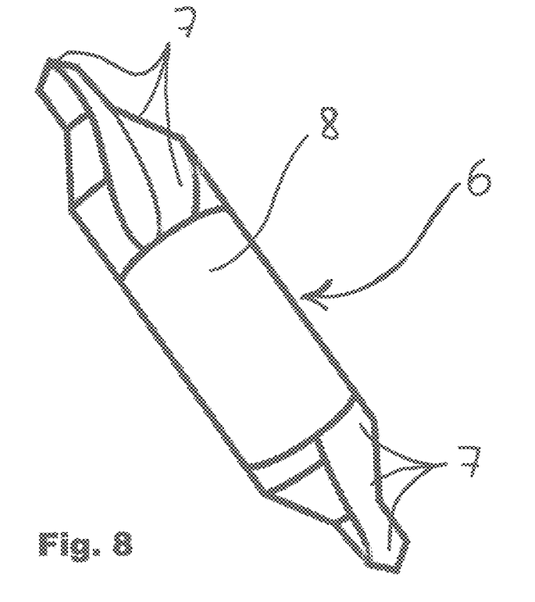

At first, reference is made to FIG. 8.

FIG. 8 shows an object to be coated 6 in the shape of a double-ended tool. Such a tool can be embodied as a grip drill for a turning machine. Grip drills as such are state of the art. Other double-ended tools of similar structure are known as double-ended milling tools or double-ended screwing bits, for example.

As shown by FIG. 8, such a tool processes a first and a second tip 7 to be coated with a wear reducing layer. Such a layer can be for example a TiN-layer or another, even more costly layer, like a DC-layer. Between the two tips 7 an intermediate portion 8 (which constitutes a non-working surface) is located which should not be coated, and which therefore needs to be masked or shielded. Said non-working surface is the area between the lower (or inboard) ends of the spiral "flutes" found at each end of the tool. If such tools are provided as high precision tools, their shafts for being chucked are not allowed to be coated in order not to deteriorate their precise nominal diameter.

The intermediate portion 8 mostly has a circular cross-section. This is the preferred broadest sense, but it is not mandatory. Other such double-ended tools can have, for example, a hexagonal cross-section or even an irregular cross-section.

Figures 1A, 1B:
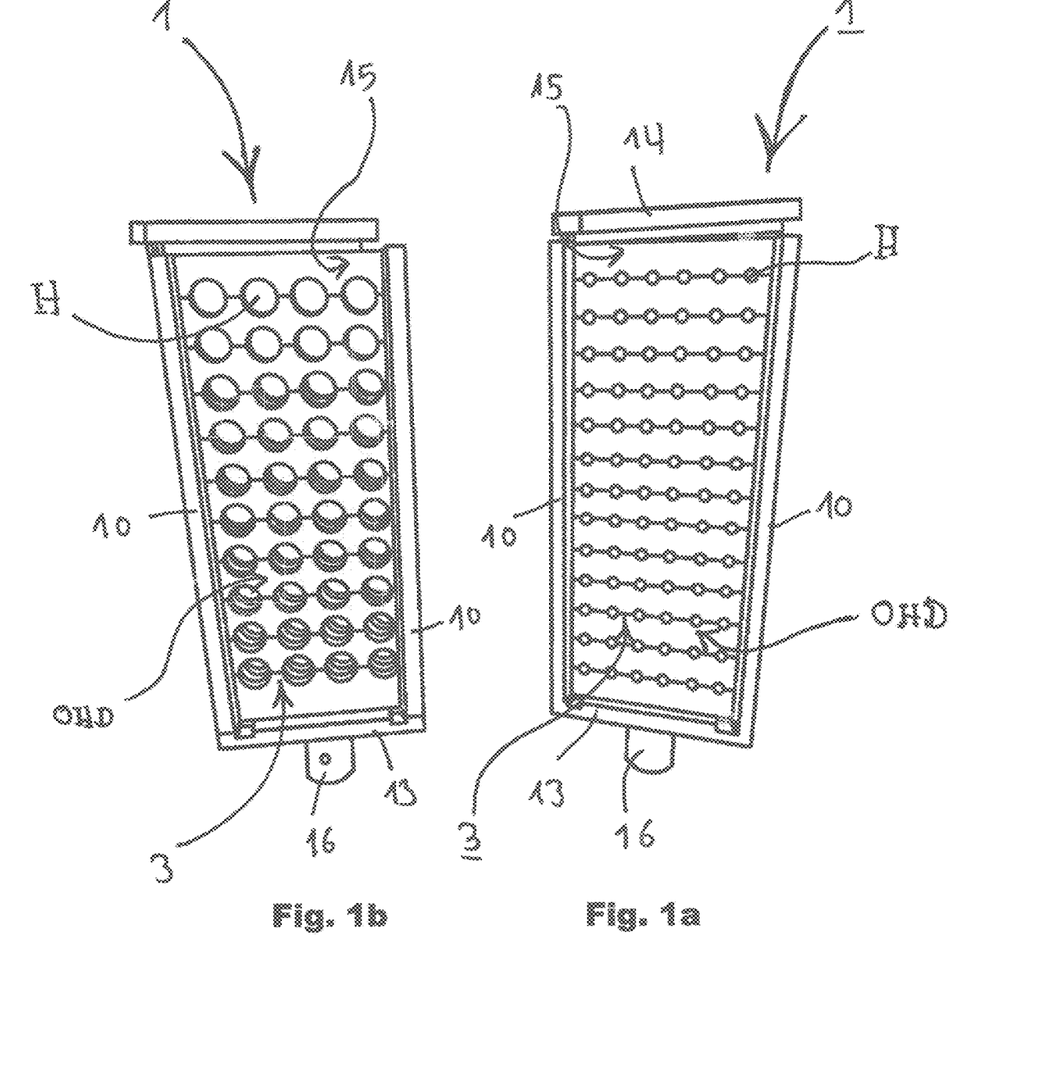

FIG. 1a shows a preferred embodiment of the inventive fixture 1. An important, mostly centrally arranged portion is the object holding device OHD. It is embodied here in the shape of at least one battery 3 of hole plate strips 2.

In the case shown here, the fixing hole plate strips 2 within one battery 3 contact each other along their longer lateral faces. They are arranged in sequence one after the other, preferably in vertical direction.

In other words: What can clearly be seen here is the preferred fact that the hole plate strips 2, which form said battery 3, are positioned one behind the other in at least substantially, mostly perfect alignment. That way a battery 3 of hole plate strips 2 forms a planar main surface 15 of the object holding device OHD, see FIG. 1a again.

The fixing hole plate strips embody holes H. Each hole H is provided for grasping and holding one object to be coated 6. Each hole H can therefore be named "retaining hole". It will be described in greater detail later on.

In this embodiment the inventive fixture additionally comprises two lateral bars 10, a base cross bar 13 and the closing cross bar 14. In this case, said cross bars form a four-sided frame which embraces the at least one, or each battery 3 of the hole plate strips 2. It goes without saying that the base cross bar 13—for example—must not mandatorily be embodied as a bar. Instead, any other kind of block or body would be possible here, too, even if the bar-form is clearly preferred.

Preferably, the base cross bar 13—or the according structure replacing it—is equipped with a bearing pin 16 for bearing the fixture rotatably in relation to a base or foot portion, which is not disclosed here.

Next, FIG. 1b is to be taken into consideration. FIG. 1b shows basically the same inventive fixture 1 as FIG. 1a.

The difference is that here differently designed strip holding devices have been mounted between said bars 10 (or the structure replacing it) so that double-ended tools with a different diameter or cross-section can be exposed to the coating process. That way a fixture system is formed that consists of a fixture 1 as shown by FIG. 1a and at least one additional set of different hole plate strips 2.

Figures 2, 3:
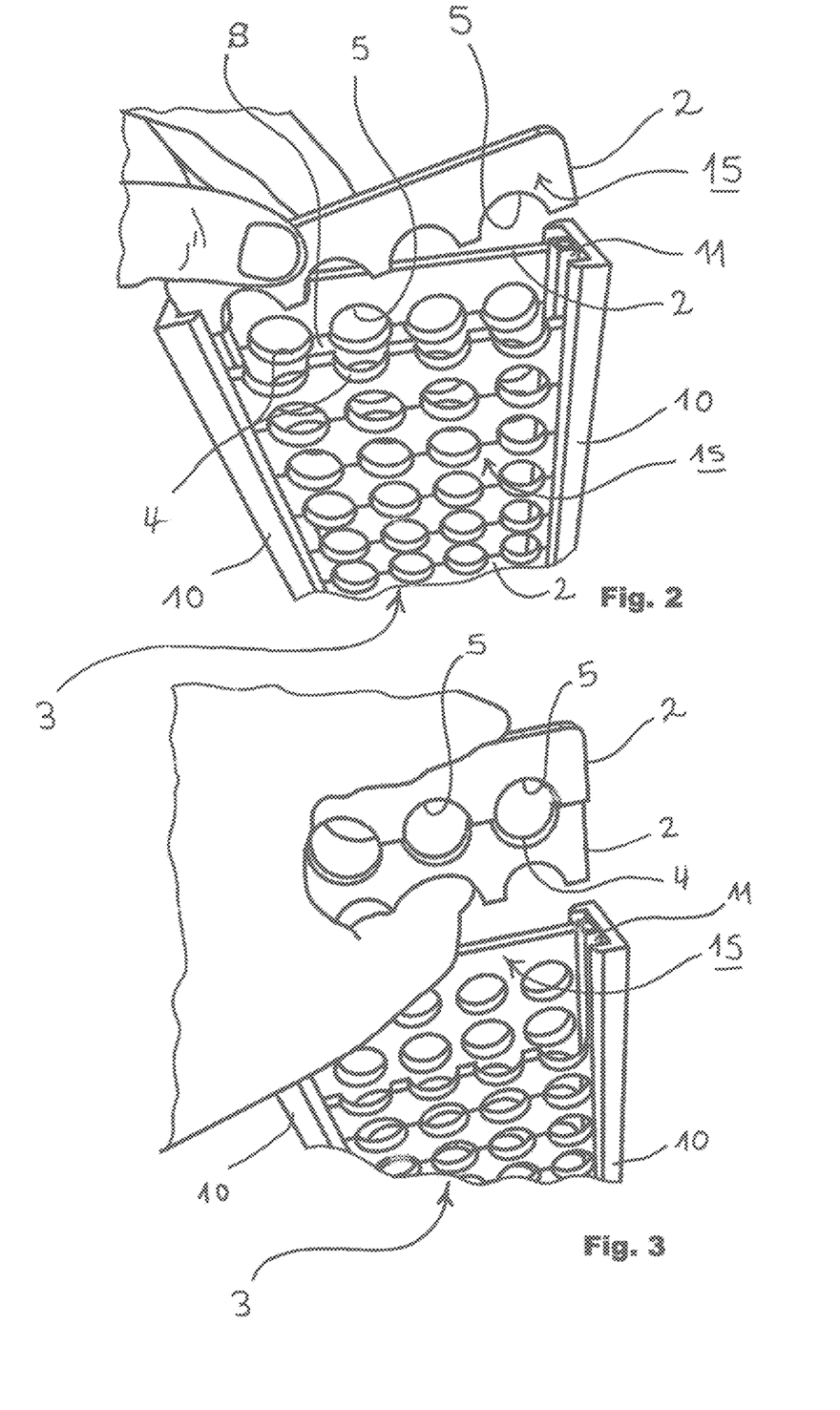

FIGS. 2 and 3 show more details in regard to the hole plate strips 2.

As one can see, every hole plate strip 2 embodies a first segment 4 of at least one hole H, preferably first segments 4 of more than three holes H.

The next hole plate strip 2—that is directly following within the hole plate strip battery 3—embodies a second segment 5 of the same at least one hole H. Preferably, the two segments 4 and 5 of each hole act like a pipe clamp, i.e. they clamp the object to be coated 6 as soon as the two consecutive hole plate strips are positioned one after another contacting each other at one front face.

Preferably, the jacket surface of each of the segments 4, 5 is in circumferential direction in continuous linear, or better full area contact with the object to be coated 6. That way the intermediate portion 8 of the object to be coated 6 is reliably masked, even if only one battery 3 of hole plate strips 2 is provided.

As can be seen from these Figures, too, a preferred embodiment of the hole plate strips is as follows:

Each hole plate strip has a rectangular outer shape, with two shorter lateral faces and two longer front faces. Normally, the front faces are at least four times longer than the lateral faces. The front faces contact each other when the hole plate strips are sequenced one after the other for forming a hole plate strip battery 3.

Hole plate strips comprised by the inventive fixture are designed preferably that way that the hole plate strip is equipped with first and second hole segments 4, 5 at its said both, opposite front faces. With other words: The hole plate strip carries at least one, preferably more than three first segments 4 of the at least one hole H at its first front face. And the hole plate strip carries at least one, preferably more than three second segments 5 of the at least one hole H at its second front face.

In most cases a battery 3 of hole plate strips comprises in addition one end strip in the shape of a hole plate strip that carries only at one front face at least one hole section 4, and one end strip in the shape of a hole plate strip that carries only at one front face at least one hole section 5. The other front face of each end piece carries no hole section.

Figure 4:
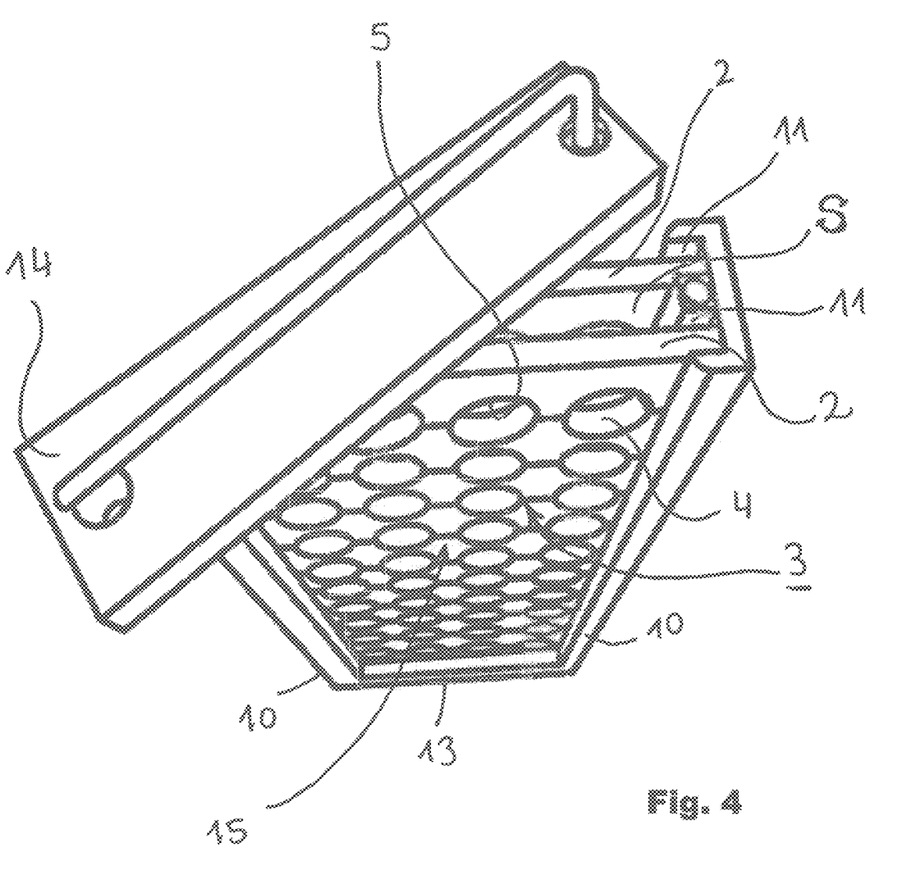
Figure 5A:
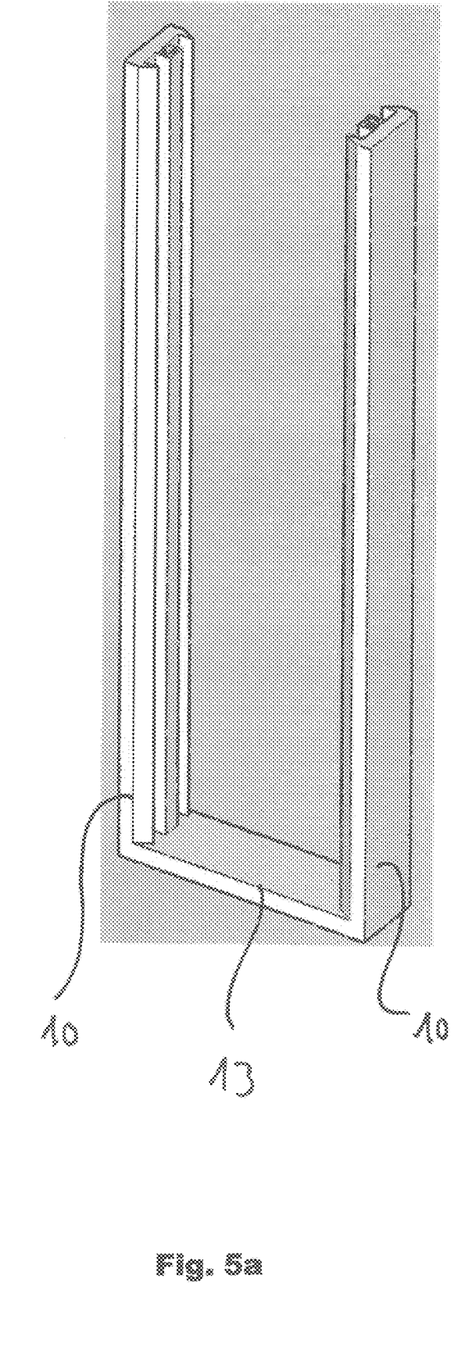
Figure 5B:
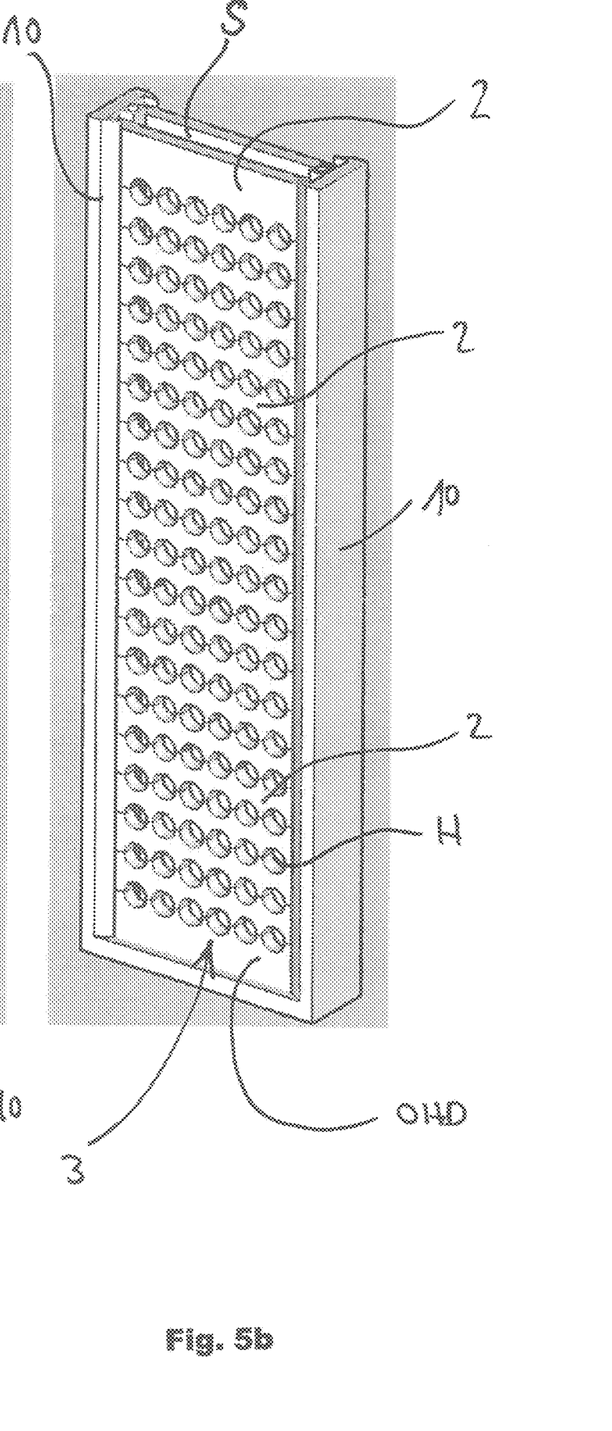
Figure 5C:
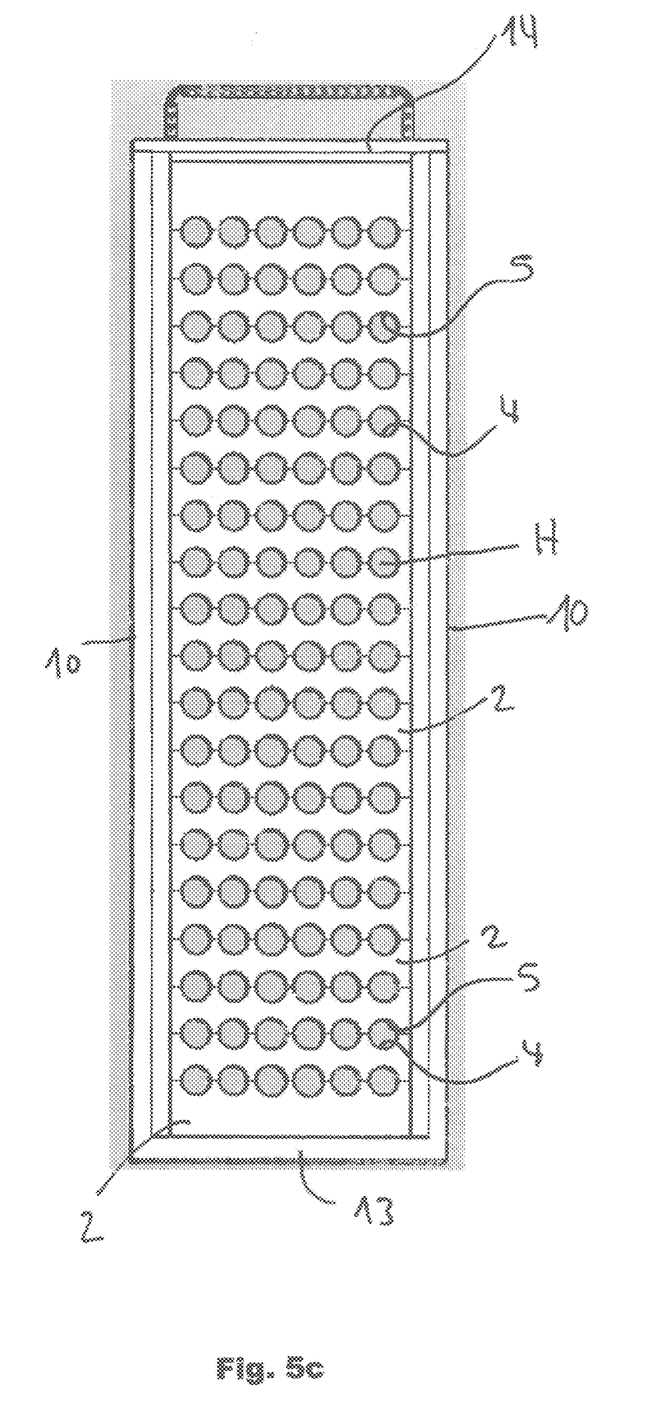
Figure 5D:
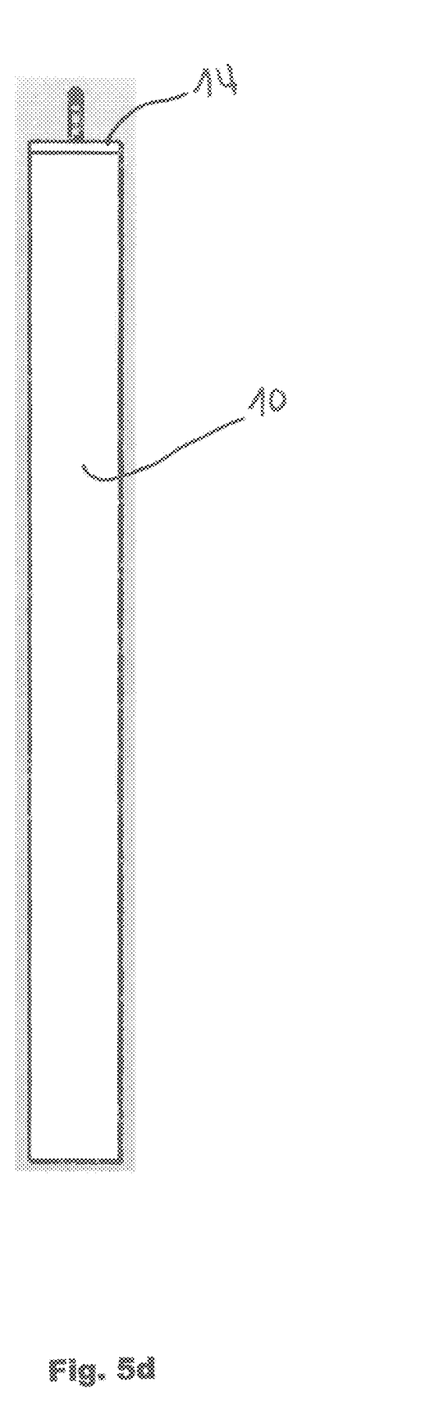

FIGS. 2 to 4 show how the lateral bars 10 form rail devices.

For that purpose, every lateral bar 10 is equipped with one—preferably continuous—slot 11 per battery 3. That way each battery 3 can be formed by introducing or threading up the according number of hole plate strips 2 between the slots 11 of two opposite lateral bars 10. The slots 11 and the hole plate strips 2 are designed that way that every slot 11 embraces preferably one of the above mentioned lateral faces (area) of the hole plate strip 2 that way that a sealing is accomplished.

What can be seen best by means of FIG. 4 is that the fixture 1 is preferably equipped with two batteries 3 of hole plate strips 2. The batteries 3 extend parallel to each other with a distance from each other. That way the two batteries 3 of hole plate strips 2 confine a space S together with the lateral bars 10, the base cross bar 13 and the closing cross bar 14. This space S is shielded or masked against the access of the vapor depositing as a coating on the object to be coated 6.

Figure 6:
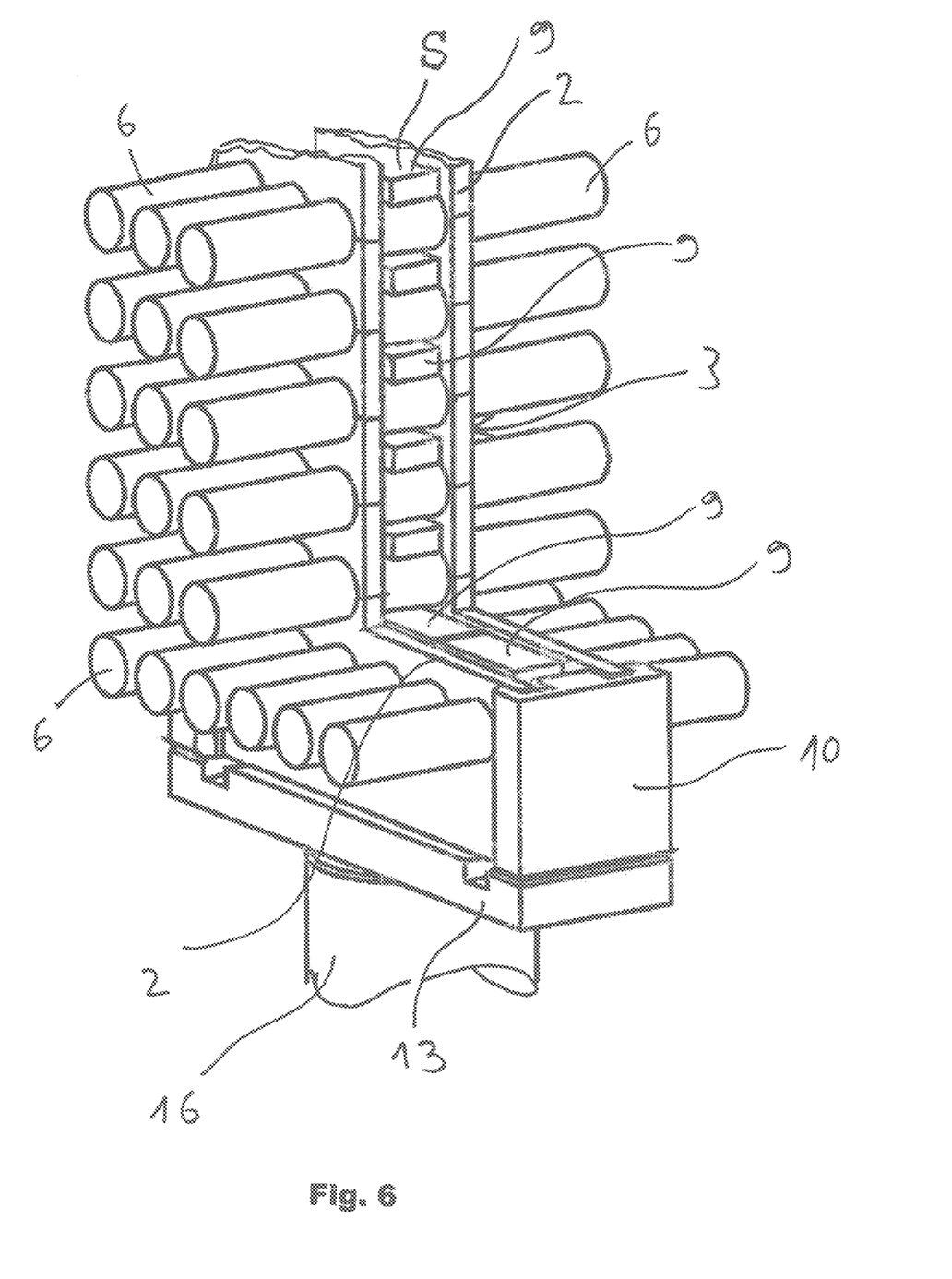

The space S is shown in greater detail by FIG. 6. Here one can clearly see how every object to be coated 6 extends through totally four hole plate strips 2 of two parallel batteries 3 of hole plate strips 2. That way every object to be coated 6 possesses two free ends that extend (here in horizontal direction) into the coating chamber, whereas its intermediate portion 8 is positioned within the space S that is masked or shielded.

Sometimes the object to be coated may have a circumferential recess, not shown. Such a recess may allow that the object to be coated 6 can be grasped or clamped by two hole plate strips 2 in a way that no movement in direction of the longitudinal axis L of the object to be coated 6 is possible any more.

In other cases the object to be coated 6 has a more or less strictly cylindrical or rod-like shape. In this case an additional means for blocking the object to be coated 6 against movements in direction of the longitudinal axis L is necessary.

Figure 7:
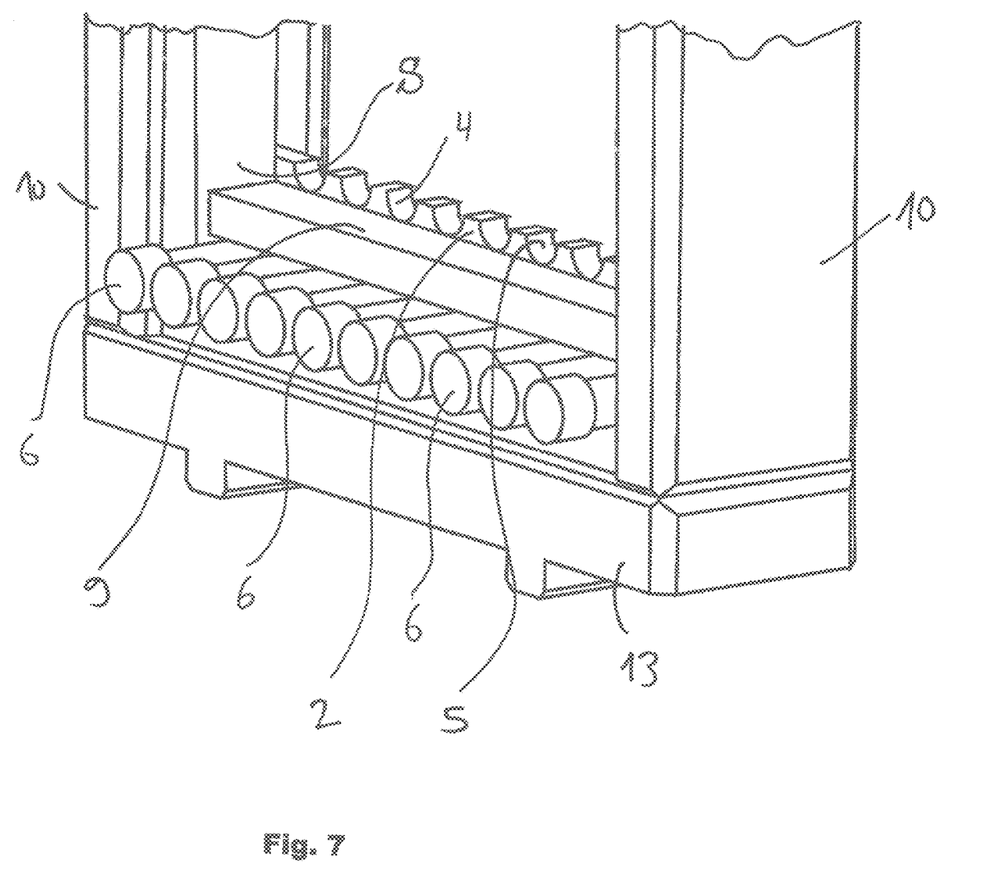

The preferred means to do so is the provision of a magnet 9, as shown by FIGS. 6 and 7.

Preferably, each magnet 9 has a rod-like shape and extends over—at least essentially—the whole distance between two lateral bars 10. That way only one magnet 9 is necessary in order to fix at least one row of objects to be coated 6 and being held for that purpose between two consecutive hole plate strips 2.

The magnet 9 immobilizes the object to be coated 6 that is attracted by it either due to the fact that the magnet 9 is held in a form fit manner between the interior surfaces of the two opposite batteries of hole plate strips 2. Alternatively or additionally, the magnet 9 immobilizes the object to be coated 6 that is attracted by it due to the fact that it attracts the objects being positioned directly below it as well as the objects being positioned directly above it. That way a kind of cluster is produced that is immobilized under the influence of its gravity.

LIST OF REFERENCE NUMBERS

1 fixture
2 hole plate strip
3 battery of hole plate strips
4 first segment of a hole
5 second segment of a hole
6 object to be coated
7 tip of the object to be coated
8 intermediate portion of the object to be coated (portion to be masked)
9 magnet
10 bar or lateral bar embodying a guide installation
11 slot for holding a hole plate strip
12 not assigned
13 base cross bar
14 closing cross bar
15 planar main surface of the object holding device
16 bearing pin
L longitudinal axis of the object to be held and coated
OHD object holding device
H hole
S space that is masked or shielded
SV sleeve used by the state of the art

The invention claimed is:

1. A fixture for exposing two opposite ends of an object to be coated to a vapor deposition while masking an intermediate portion of the object against being coated, comprising:

an object holding device consisting of two batteries of hole plate strips which are designed and arranged such that each single hole is formed by a pair of hole plate strips such that a first segment of the hole is embodied by a preceding hole plate strip and a second segment of the hole is embodied by a subsequent hole plate strip, wherein the two batteries of hole plate strips are arranged in parallel with a distance between each other shielded or masked against the access of the vapor depositing as a coating on the object to be coated and therefore form a masked interior space between one another which is free from vapor deposition.

2. The fixture according to claim 1, wherein each of the holes is in surface contact with a grasped object along a whole circumference of the hole.

3. The fixture according to claim 1, wherein the object holding device comprises magnets that attract and additionally immobilize objects held by the hole plate strips.

4. The fixture according to claim 3, wherein the object holding device comprises two batteries of hole plate strips which are arranged in parallel and which form a masked interior space between one another which is free from vapor deposition, and the magnets are individual parts that are positioned in said masked interior space.

5. The fixture according to claim 4, wherein the magnets are immobilized by form fit between two hole plate strips against movement in a direction of and opposite to a main axis of an object to be coated.

6. The fixture according to claim 1, wherein the fixture comprises two opposite rail devices for threading up hole plate strips between the rail devices.

7. The fixture according to claim 6, wherein each rail device comprises two parallel guide installations, each guide installation being embodied as a slot embracing a face side of the hole plate strips inserted into this slot.

8. The fixture according to claim 6, wherein each of the rail devices is formed by a vertically oriented, one-part bar, wherein each bar is carried by a base cross bar which is horizontally oriented.

9. The fixture according to claim 8, wherein the fixture comprises a foot unit which rotatably bears the base cross bar.

10. The fixture according to claim 8, wherein the fixture comprises a closing cross bar which can be opened or removed for threading up hole plate strips, and which can be closed hereinafter.

11. The fixture according to claim 1, wherein said object holding device has planar main surfaces with the main surfaces oriented vertically.

12. A fixture system for exposing two opposite ends of an object to be coated to a vapor deposition while masking an intermediate portion of the object against being coated, comprising:
the fixture according to claim 1 with different hole plate strips embodying different hole segments, wherein the hole segments differ in diameter, or in average diameter, or in clear cross section, or in number of hole segments and/or in position of hole segments.

13. A vapor deposition installation with a deposition chamber, at least one target, an evacuation pump, a working gas inlet unit, and a fixture according to claim 1, wherein said fixture is rotatably borne in the deposition chamber and can be set in rotation during vapor deposition.

14. A method using the apparatus of claim 1 for exposing two opposite ends of an object to be coated concurrently to a vapor deposition while masking an intermediate portion of the object against being coated, comprising:
positioning the object to be coated relative to a first hole plate strip embodying a first segment of a hole so that said first segment of the hole embraces the object to be coated in an area to be masked against coating, and positioning the object to be coated relative to a second hole plate strip embodying a second segment of a hole so that said second segment of the hole embraces the object to be coated in an area to be masked against coating, while the first and second hole plate strips abut against each other so that the first and second hole plate strips totally embrace and hold the object to be coated.

* * * * *